(12) United States Patent
Huang et al.

(10) Patent No.: US 7,642,639 B2
(45) Date of Patent: Jan. 5, 2010

(54) COB TYPE IC PACKAGE TO ENHANCED BONDIBILITY OF BUMPS EMBEDDED IN SUBSTRATE AND METHOD FOR FABRICATING THE SAME

(75) Inventors: Hsiang-Ming Huang, Tainan (TW); An-Hong Liu, Tainan (TW); Yeong-Jyh Lin, Tainan (TW); Yi-Chang Lee, Tainan (TW)

(73) Assignees: ChipMos Technologies Inc., Hsinchu (TW); ChipMos Technologies (Bermuda) Ltd., Hamilton (BM)

( * ) Notice: Subject to any disclaimer, the term of this patent is extended or adjusted under 35 U.S.C. 154(b) by 401 days.

(21) Appl. No.: 11/583,951

(22) Filed: Oct. 20, 2006

(65) Prior Publication Data
US 2007/0262439 A1   Nov. 15, 2007

(30) Foreign Application Priority Data
May 12, 2006   (CN)   ................... 95 1 16910

(51) Int. Cl.
*H01L 23/04* (2006.01)
*H01L 23/48* (2006.01)
(52) U.S. Cl. .................. 257/698; 257/735; 257/772; 257/773; 257/776; 257/779; 257/E23.02; 257/E23.04; 438/612; 438/613

(58) Field of Classification Search ........... 257/690, 257/693, 698, 734, 772–774, 776, 779, 780–795, 257/E23.015, E23.02, E23.023–E23.079; 438/613–617; 228/180.22
See application file for complete search history.

(56) References Cited

U.S. PATENT DOCUMENTS

| | | | |
|---|---|---|---|
| 5,892,271 A * | 4/1999 | Takeda et al. ............... 257/668 |
| 6,376,279 B1 * | 4/2002 | Kwon et al. ................ 438/113 |
| 7,129,576 B2 * | 10/2006 | Humpston .................. 257/704 |
| 2007/0235871 A1 * | 10/2007 | Huang et al. ................ 257/737 |

* cited by examiner

*Primary Examiner*—Jasmine J Clark
(74) *Attorney, Agent, or Firm*—WPAT, P.C.; Anthony King

(57) ABSTRACT

An IC package to enhance the bondibility of embedded bumps, primarily includes a substrate having a plurality of bump-accommodating holes, a bumped chip, an encapsulant, and a plurality of external terminals. The substrate further has a plurality of inner pads at one ends of the bump-accommodating holes respectively. The inner pads may be meshed or a soldering layer is disposed thereon for improving bump connection. The chip is attached to the substrate with the bumps aligned and embedded in the corresponding bump-accommodating holes. The encapsulant is at least formed on a lower surface of the substrate to encapsulate the meshes or the soldering layer. By the suspended meshes or/and the soldering layer, the bumps can be easily bonded at lower temperatures to simplify the manufacturing process with shorter electrical conductive paths and thinner package profiles without wire sweeping.

24 Claims, 9 Drawing Sheets

COB TYPE IC PACKAGE TO ENHANCED BONDIBILITY OF BUMPS EMBEDDED IN SUBSTRATE AND METHOD FOR FABRICATING THE SAME

FIELD OF THE INVENTION

The present invention relates to a Chip-On-Board, COB, IC package with a thinner profile and simplified processes, and more particularly, to a Ball Grid Array Package with bumps embedded in the substrate.

BACKGROUND OF THE INVENTION

In the mass production of the IC packages, especially for memory packages, the development of the advanced packaging technologies is to simplify packaging processes for IC chips operating in higher frequencies. One kind of the current packages for the DDR II DRAM or XDR DRAM may be called as Chip-On-Board (COB), Board-On-Chip (BOC), or window BGA where a chip is directly attached to a wiring substrate. The chip is electrically connected to the substrate by a plurality bonding wires passing through the slot on the substrate. Then, the chip, the bonding wires, and the substrate are encapsulated by an encapsulant. Finally, solder balls are placed under the bottom surface of the substrate for external terminals for the packages. Compared to the leadframe-based packages such as TSOP, there are no outer leads extended from the sides of the encapsulant so that the electrical conductive paths are much shorter and the package footprint is much smaller.

As shown in FIG. 1, a conventional COB package 100 primarily includes a substrate 110, a chip 120, a plurality of bonding wires 140, an encapsulant 150, and a plurality of solder balls 160. The manufacturing process of the COB package 100 is also shown in FIG. 2. In step 11, a substrate 110 is provided. The substrate 110 has a first surface 111, a second surface 112, and a slot 113 for the passing of the bonding wires 140 where the substrate 110 is a rigid printed circuit board. Then, in step 12, the active surface 121 of the chip 120 is attached to the first surface 111 of the substrate 110 by a die-attaching film 130 where a plurality of bonding pads 122 formed on the active surface 121 of the chip 120 are aligned within the slot 113. Then, in step 13, wire bonding is performed for electrical connection, the bonding pads 122 of the chip 120 are electrically connected to the inner pads of the traces 114 of the substrate 110 by a plurality of bonding wires 140 passing through the slot 113. Then, in step 14, the chip 120 and the bonding wires 140 are encapsulated by an encapsulant 150 by molding. Finally, in step 15, the solder balls 160 are placed on the ball pads connected with the traces 114 of the substrate 110 on the second surface 112 of the substrate 110. After singulation, the package 100 is manufactured, which can electrically connect to external printed circuit boards such as mother boards, communication boards, or memory modules by SMT. However, the lengths of the bonding wires are too long to be implemented in high-speed applications, moreover, the manufacturing process are too complicated. For the high-speed applications in the future, the packages need to be much thinner and much lighter.

SUMMARY OF THE INVENTION

The main purpose of the present invention is to provide an IC package and its manufacturing process to simplify the manufacturing process to increase the throughput with shorter electrical conductive paths and thinner package profiles without wire sweeping.

The second purpose of the present invention is to provide an IC package having a substrate with meshed inner pads suspended in the bump-accommodating holes to enhance the bondibility of the bumps.

The third purpose of the present invention is to provide an IC package to achieve embedded bumps bonding at lower bonding temperatures.

According to the present invention, an IC package primarily includes a substrate, a chip, an encapsulant, and a plurality of external terminals where the substrate has a first surface, a second surface, and a plurality of bump-accommodating holes. A plurality of meshed inner pads are disposed at one ends of the corresponding bump-accommodating holes on the second surface. The chip has an active surface with a plurality of bumps disposed thereon. The chip is disposed on the first surface of the substrate, wherein the bumps are placed inside the corresponding bump-accommodating holes and are caught by the meshed inner pads respectively. The encapsulant is formed on the second surface of the substrate to encapsulate the meshed inner pads. The external terminals are disposed on the exposed second surface. The corresponding manufacturing process of the high-speed IC package is also revealed. The electrical connection of the chip and the substrate is performed during the die-attaching step to simplify the process steps and to ensure the thinner profiles with the embedded bumps.

According to another embodiment of the present invention, another IC package primarily includes a substrate, a chip, and a die-attaching material. The substrate has a first surface, a second surface, and a plurality of bump-accommodating holes where a plurality of inner pads are disposed at one ends of the bump-accommodating holes. A soldering layer is formed on the inner pads. The chip has an active surface and a plurality of bumps disposed on the active surface. The active surface of the chip is attached to the first surface of the substrate by the die-attaching material with the bumps aligned and embedded inside the corresponding bump-accommodating holes. The bumps are electrically connected to the inner pads by the soldering layer. The corresponding manufacturing processes of another high-speed IC are also revealed. The electrical connection of the chip to the substrate is performed during the die-attaching step to simplify the process steps and to ensure the thinner profiles with the embedded bumps.

DETAIL DESCRIPTION OF THE INVENTION

Please refer to the attached drawings, the present invention will be described by means of embodiment(s) below.

Figure 1:
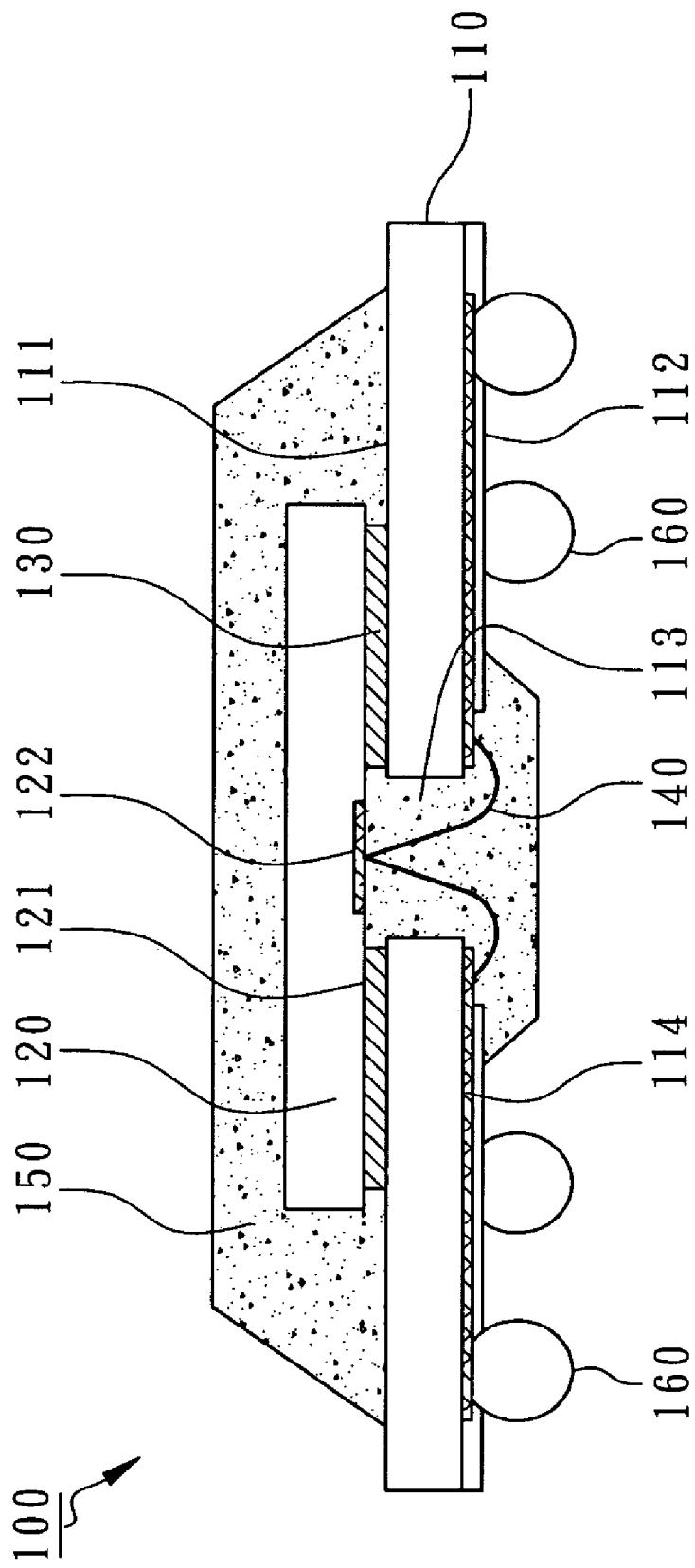
FIG. 1 shows the cross sectional view of a conventional COB package.
Figure 2:
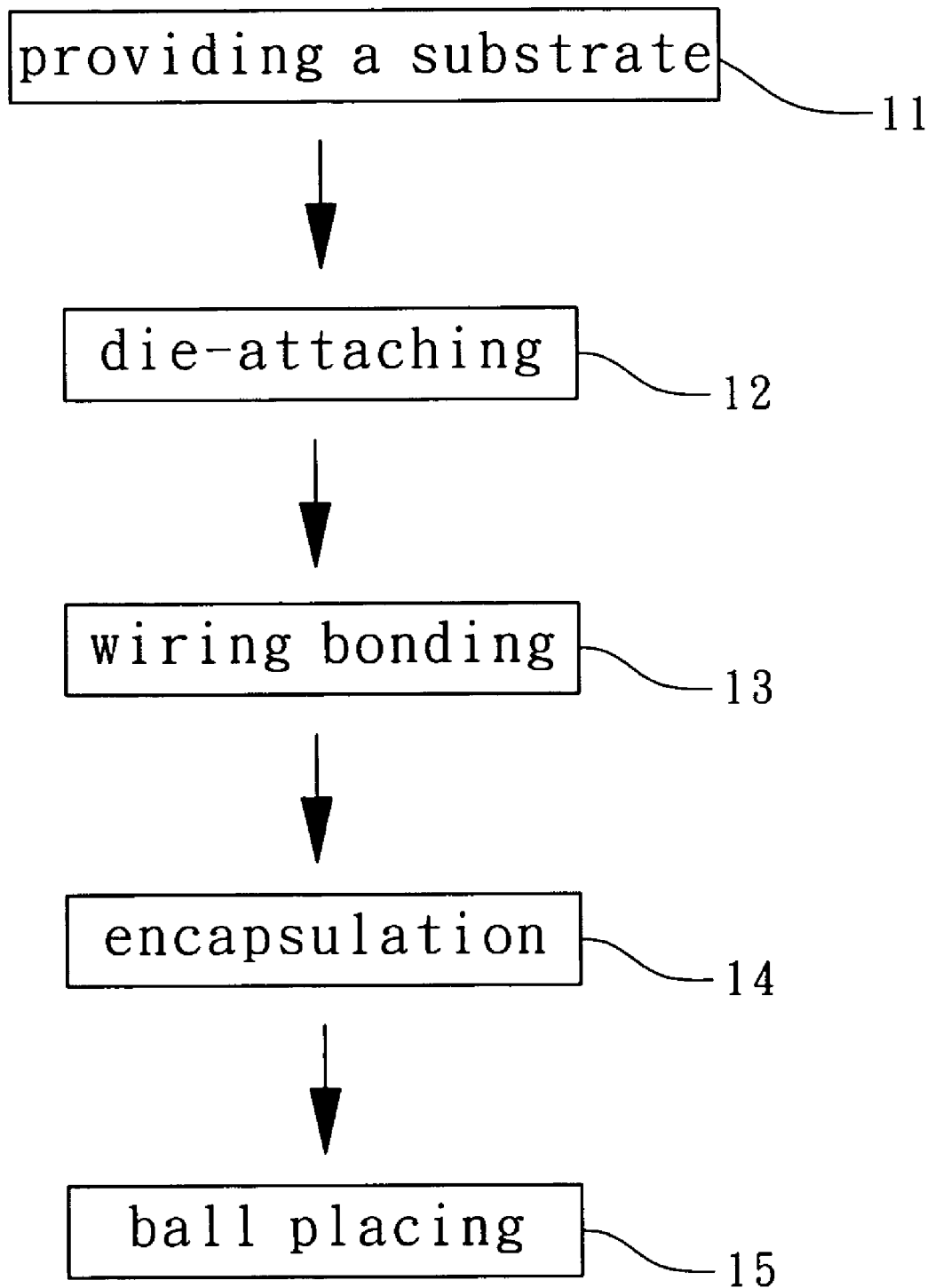
FIG. 2 shows the process flow for manufacturing the conventional COB package.
Figure 3:
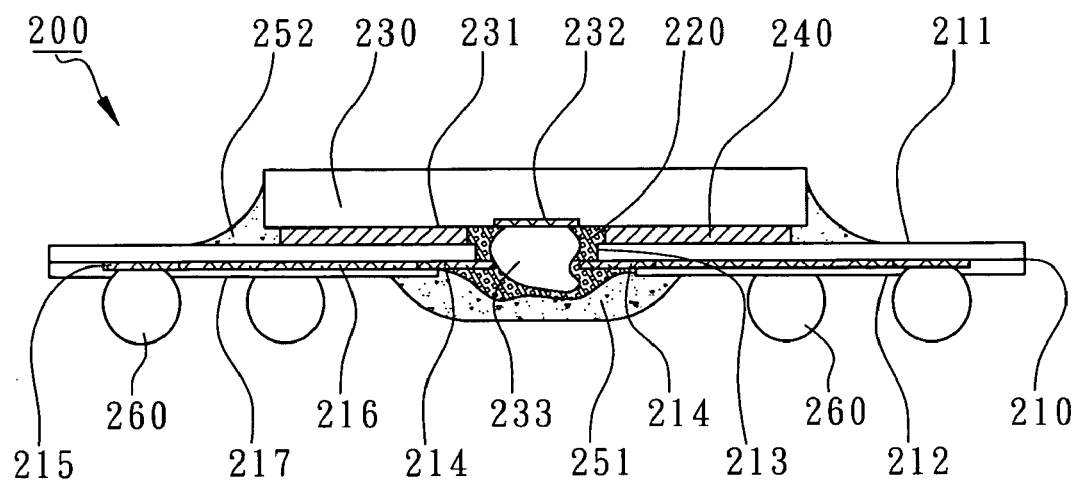
FIG. 3 shows the cross sectional view of an IC package according to the first embodiment of the present invention.

According to the first embodiment of the present invention, as revealed in FIG. 3, an IC package 200 primarily includes a substrate 210 with a soldering layer 220, a bumped chip 230, and a die-attaching material 240 where the substrate 210 has a first surface 211, a second surface 212, and a plurality of bump-accommodating holes 213. In the present embodiment, a wiring layer 216 is formed on the second surface 212 of the substrate 210, which includes a plurality of inner pads 214 and a plurality of outer pads 215 where the inner pads 214 are disposed at one ends of the corresponding bump-accommodating holes 213 toward the second surface 212. Moreover, the soldering layer 220, such as tin, tin-lead, lead-free solder with melting points under 400° C., is formed by electroplating or by printing on the inner pads 214. A solder mask 217 is formed over the second surface 212 of the substrate 210 to partially cover the wiring layer 216, but to partially expose the inner pads 214 and the outer pads 215 (as shown in FIG. 3). Preferably, the substrate 210 is a single-layer flexible printed circuit board to achieve thinner and lighter packages.

The chip 230 has an active surface 231 with a plurality of bumps 233 formed on the active surface 231 where the bumps 233 are electrically connected to the internal integrated circuits of the chip 230 (not shown in the figure) as external terminals for the chip 230. In the present embodiment, the chip 230 is a DRAM chip such as DDR II, DDR III, Rambus, XDR with operation clock rates equal or over 400 MHz. In this embodiment, the bumps 233 are stud bumps formed by wire bonding and are directly bonded to the bonding pads 232 of the chip 230 where the bonding pads 232 may be center pads or peripheral pads. The tails of the stud bumps 233 are truncated toward the corresponding inner pads 214 to enhance the soldering of the soldering layer 220.

The active surface 231 of the chip 230 is attached to the first surface 211 of the substrate 210 by the die-attaching material 240 where the die-attaching material 240 is chosen from a group of multi-step curing adhesive film, PI adhesive film, epoxy adhesive film. Preferably, the die-attaching material 240 is a B-stage compound where the liquid form of the die-attaching material 240 is pre-disposed on the first surface 211 of the substrate 210 or the active surface 231 of the chip 230 by printing, then, followed by pre-baking to become a B-stage adhesive layer. After thermal compression, the die-attaching material 240 can be adhered to the active surface 231 of the chip 230 or the first surface 211 of the substrate 210. Moreover, the bumps 233 are aligned and embedded in the corresponding bump-accommodating holes 213 and are electrically connected to the inner pads 214 by the soldering layer 220. Since the soldering layer 220 can become active even reach its melting point during the die-attaching step, therefore, the electrical connection step for the substrate 210 and the chip 230 and the die attaching step can be performed at the same time to eliminate the conventional wire bonding step to simplify the packaging processes. Moreover, the bumps 233 are embedded in the bump-accommodating holes 213 and are directly soldering to the inner pads 214 of the wiring layers 216 of the substrate 210 so that the IC package 220 has a thinner and lighter package profile with shorter electrical conducting paths, especially for the mass production of high-speed memory chip 230 with lower packaging cost.

As shown in FIG. 3 again, the IC package 200 further includes a first encapsulant 251, a second encapsulant 252, and a plurality of solder balls 260 where the first encapsulant 251 is formed on the second surface 212 of the substrate 210 by dispensing to encapsulate the soldering layer 220. The second encapsulant 252 is formed on the first surface 211 of the substrate 210 and encapsulates the sidewalls of the chip 230 and to prevent penetrated moisture to hydrolyze the die-attaching material 240. In an alternative embodiment, when the die-attaching material 240 possesses moisture-resistant, there is no need for formation of the second encapsulant 252. The solder balls 260 are disposed at the outer pads 215 of the wiring layer 216 on the second surface 212 of the substrate 210 as external terminals of the package 200. In different embodiments, the solder balls 260 can be replaced by solder paste, metal balls, metal pins, ACF, and other conductive materials.

Figure 4:
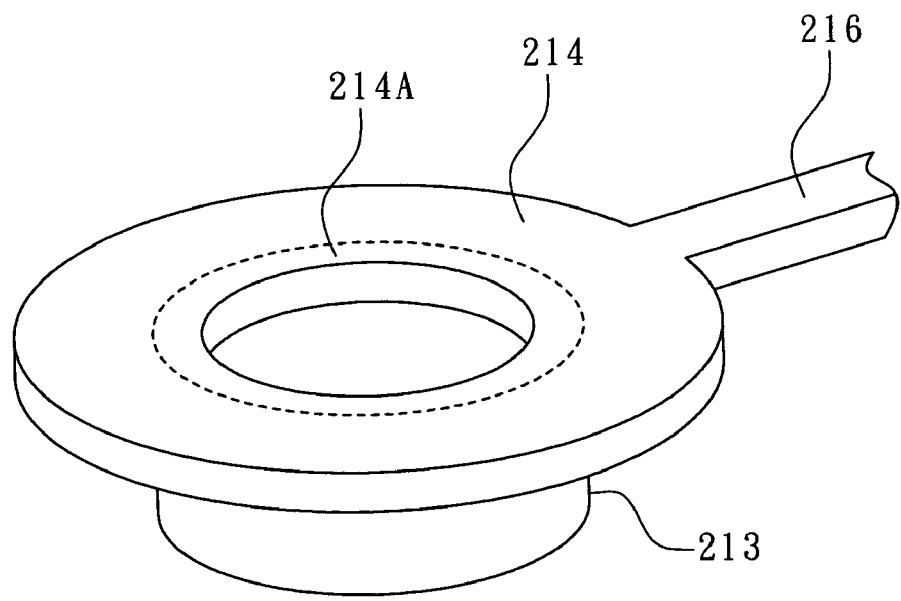
FIG. 4 shows the inner pads of the substrate of the IC package according to the first embodiment of the present invention.

As shown FIG. 4, preferably, each inner pad 214 has a round opening where each inner pad 214 has an extended ring 214A extended toward the centers of corresponding bump-accommodating holes 213 to bond the bumps 233 by the soldering layer 220 during die-attaching step. In the present embodiment, the extended ring 214A of the inner pads 214 are annular, i.e., the opening diameter of the inner pads 214 is smaller than the diameter of the bump-accommodating holes 213.

Figure 5:
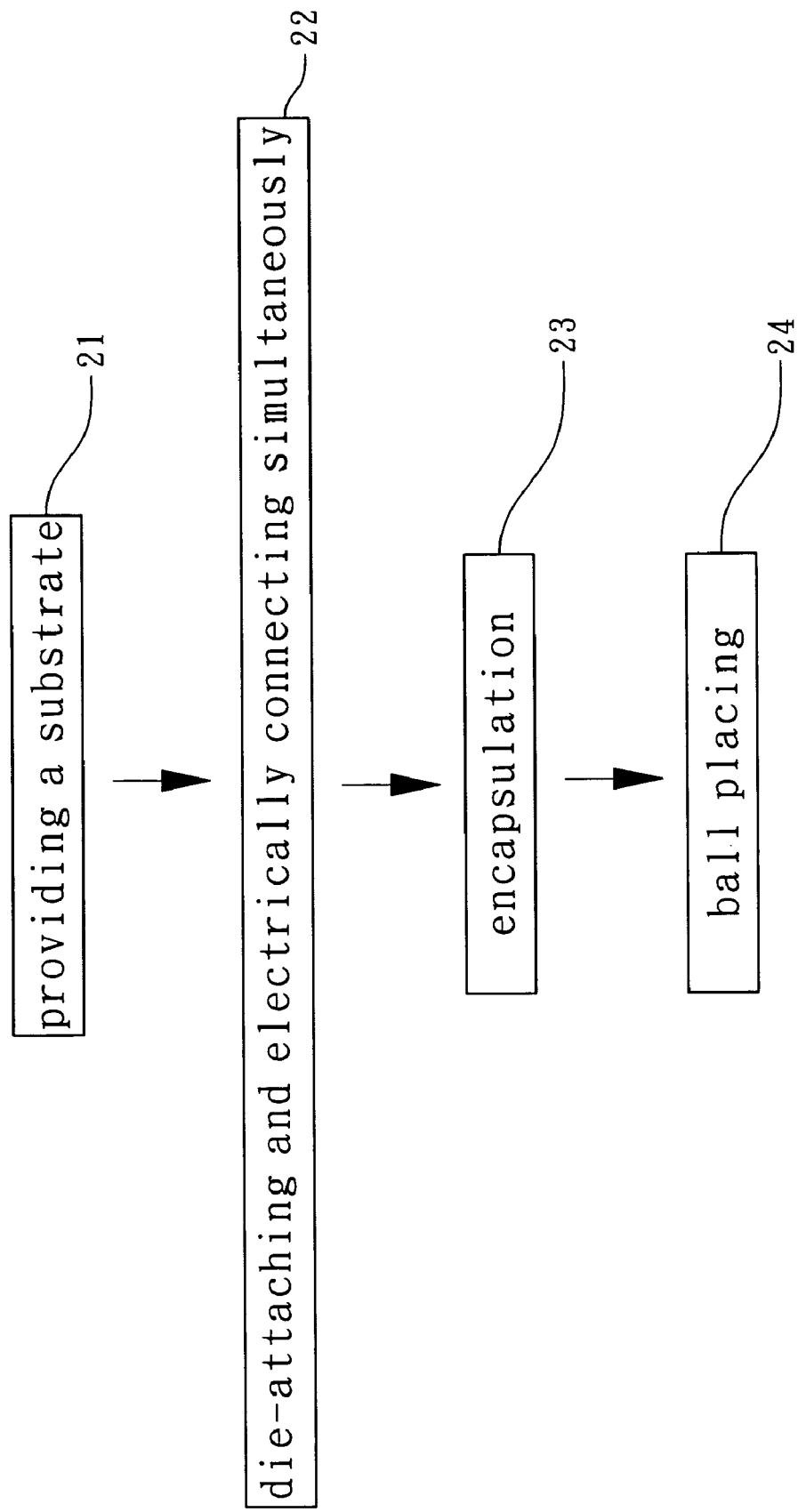
FIG. 5 shows the block diagrams of the process flow of the IC package according to the first embodiment of the present invention.
Figure 6:
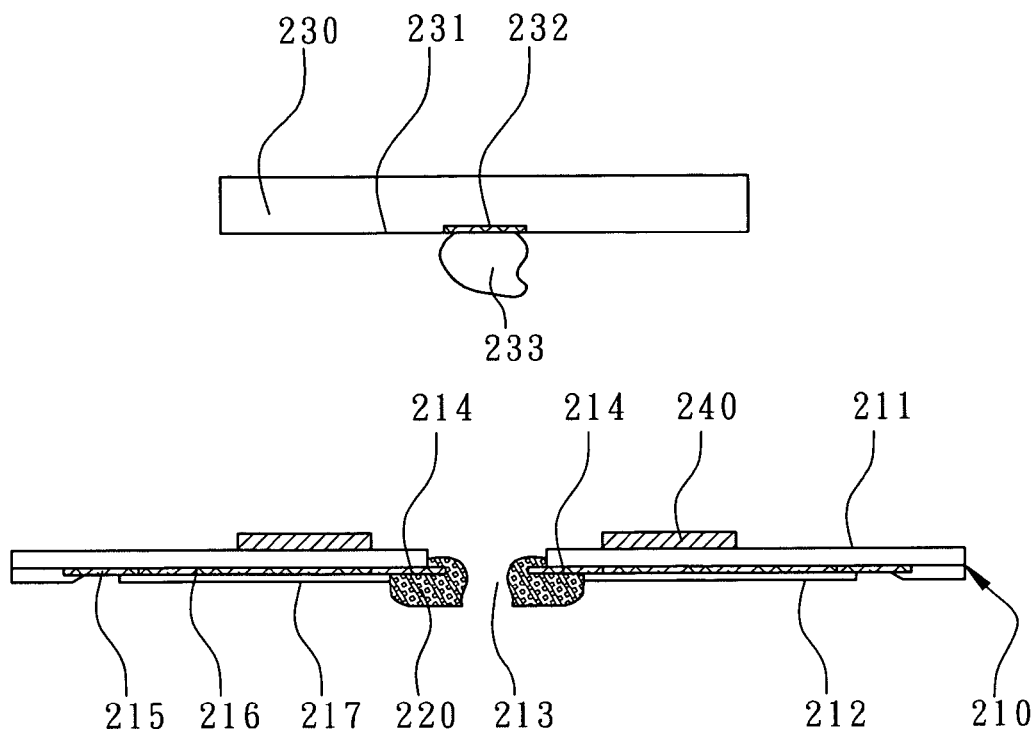
FIG. 6 shows the cross sectional view of the IC package during die-attaching step according to the first embodiment of the present invention.

As shown in FIG. 5, a manufacturing process of the IC package 200 primarily includes: step 21 of "providing a substrate", step 22 of "die attaching and electrically connecting", step 23 of "encapsulating", and step 24 of "ball placing". As shown in FIGS. 3 and 6, in step 21, a substrate 210 is provided with the soldering layer 220 pre-formed on the substrate 210 according to the present embodiment. As shown in FIG. 6 again, in step 22, the die-attaching material 240 is formed on the first surface 211 of the substrate 210 and the chip 230 is thermally pressed to the substrate 210 so that the active surface 231 of the chip 230 are attached to the substrate 210 by the die-attaching material 240 with the bumps 233 aligned and embedded in the corresponding bump-accommodating holes 213. By using the pressure and temperature required during die attaching step, not only is the chip 230 attached to the substrate 230 by the die-attaching material 240 but also are the bumps 233 bonded to the inner pads 214 by the melted soldering layer 220 without the conventional wire bonding processes. In the present embodiment, the material of the soldering layer 220 is tin (Sn) and the material of the bumps 230 is gold so that the soldering layer 220 and the bumps will form gold-tin eutectic under the die-attaching temperatures for good electrical connections. Furthermore, in step 23 of encapsulation, the first encapsulant 251 and the second encapsulant 252 are formed by dispensing. In step 24 of "balls placing", the solder balls 260 are placed on the second surface 212 of the substrate 210.

Preferably, in step 22, the heating temperature of the chip 230 is slightly higher than the one of the substrate so that the soldering layer 220 can quickly melt and wet the bumps 233 to fill the bump-accommodating holes 213 to reduce the protruded height of the soldering layer 220 from the second surface 212 of the substrate 210 so that the amount of the encapsulant 251 can be reduced with a lower height to encapsulate the soldering layer 220.

Figure 7:
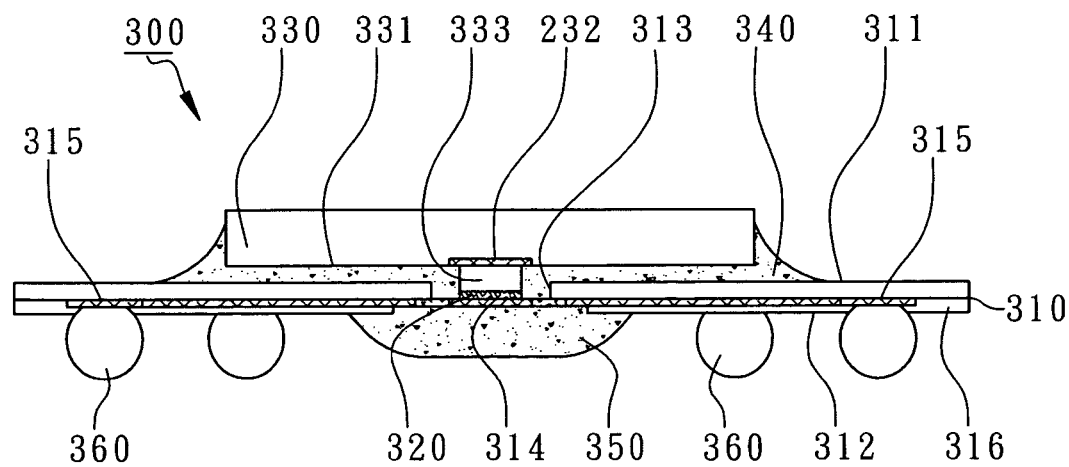
FIG. 7 shows the cross sectional view of an IC package according to the second embodiment of the present invention.

As shown in FIG. 7, in the second embodiment of the present invention, another IC package 300 primarily includes a substrate 310 with a pre-formed soldering layer 320, a bumped chip 330, and a die-attaching material 340 where the substrate 310 has a first surface 311, a second surface 312, and a plurality of bump-accommodating holes 313. A plurality of inner pad 314 are disposed at the bottom of corresponding bump-accommodating holes 313 and a soldering layer 320 is formed on the surface of the inner pads 314 where the inner pads 314 can be connected to the traces of the substrate 310 in a same wiring layer. The wiring layer is formed on the second surface 312 of the substrate 310, further including a plurality of outer pads 315 partially covered by a solder mask 316. The chip 330 has an active surface 331 and a plurality of bumps 333 formed on the bonding pads 332 of the active surface 331. In the present embodiment, the bumps 333 are pillar-like gold bumps formed by electroplating. The active surface 331 of the chip 330 is attached to the first surface 311 of the substrate 310 by die-attaching material 340 with the bumps 333 aligned and embedded in the bump-accommodating holes 313. In the present embodiment, the die-attaching material 340 may be an underfilling material or non-conductive paste (NCP) and can be cured during or after the forming of the electrical connections between the bumps 333 and the inner pads 314 by the soldering layer 320. In a further implementation of the present embodiment, the IC package 300 further includes an encapsulant 350 and a plurality of solder balls 360 where the encapsulant 350 can be formed by dispensing or by molding to encapsulate the soldering layer 320 and the inner pads 314. The solder balls 360 are disposed on the outer pads 315 on the second surface 312 of the substrate 310.

Figure 8:
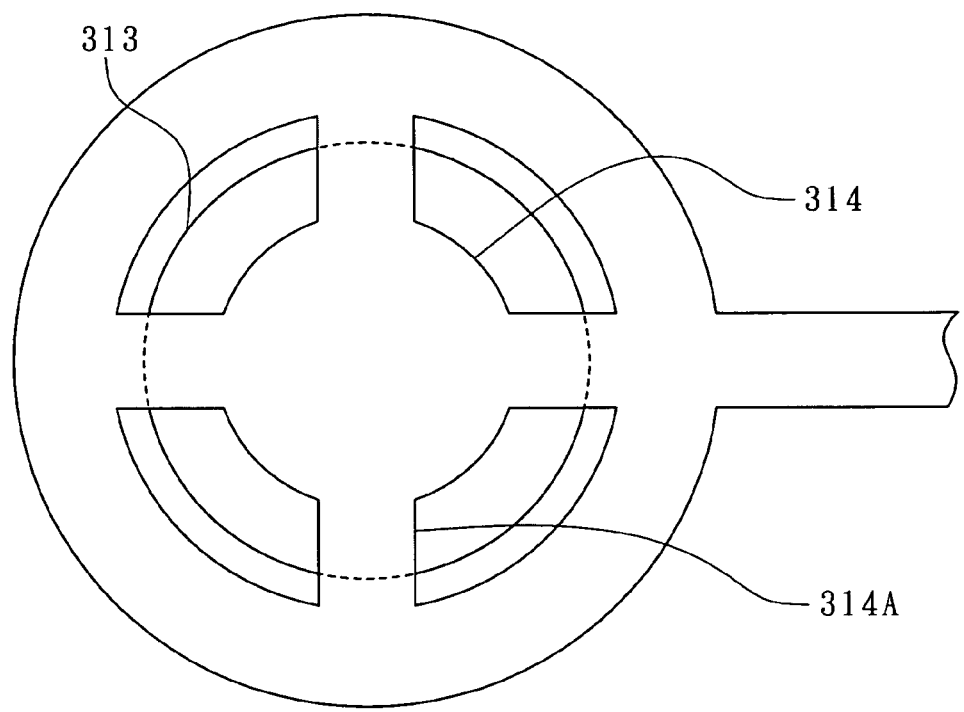
FIG. 8 shows the inner pads of the substrate of the IC package according to the second embodiment of the present invention.

Preferably, as shown in FIG. 8, the inner pads 314 are suspended metal pads suspended in the bump-accommodating holes 313 with a plurality of tie bars 314a connected to the wiring layer of the substrate 310 so that the soldering layer 320 on the inner pads 314 can be melted to wet the bumps 333 for electrical connection. Moreover, the spacing between the tie bars 314a of the inner pads 314 can further enhance the outgassing of the die-attaching material 340 during die attaching step and the filling of the bump-accommodating holes 313 by the encapsulant 350 to completely encapsulate the inner pads 314.

Figure 9:
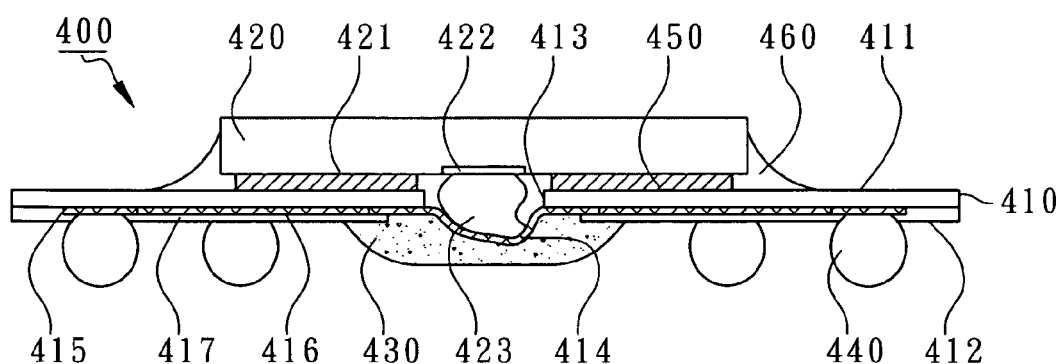
FIG. 9 shows the cross sectional view of an IC package with enhanced bondibility of the embedded bumps according to the third embodiment of the present invention.
Figure 10:
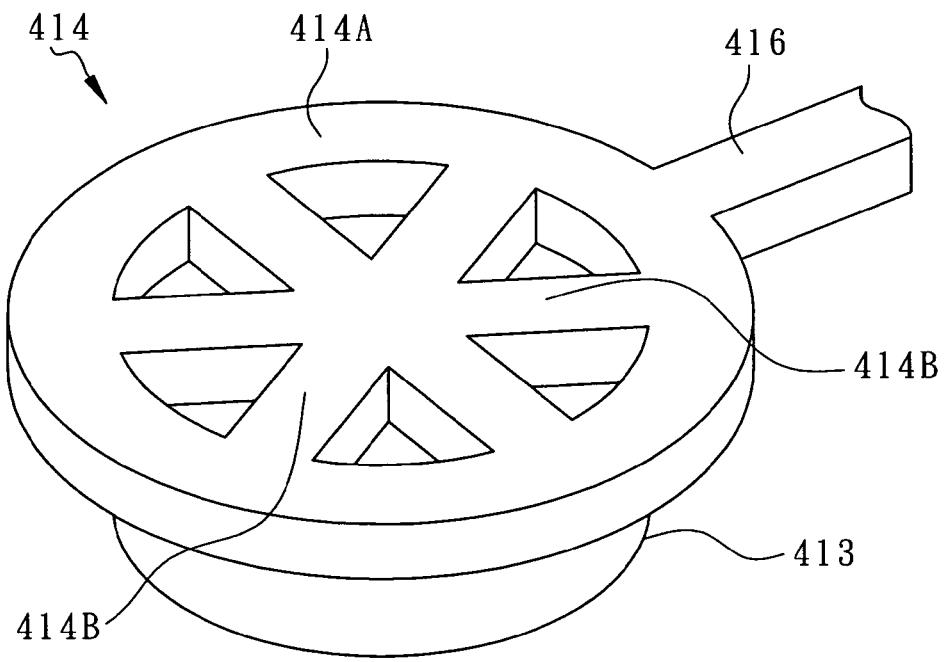
FIG. 10 shows the inner pads of the substrate of the IC package according to the third embodiment of the present invention.

As shown in FIG. 9, in the third embodiment of the present invention, an IC package 400 primarily includes a substrate 410, a chip 420, an encapsulant 430, and a plurality of external terminals 440 where the substrate 410 has a first surface 411, a second surface 412, and a plurality of bump-accommodating holes 413 penetrating the first surface 411 and the second surface 412. A plurality of inner pads 414 are disposed at one ends of the bump-accommodating holes 413 on the second surface 412 where a mesh-like structure is formed on each inner pad 414 so that the inner pads 414 becomes more flexible and ductile to enhance the bondibility of the bumps 423. For example, as shown in FIG. 10, each inner pad 414 has an annular frame 414A with a plurality of spokes 414B extended from the annular frame 414A to the centers of the bump-accommodating hole 413 to form a meshes suspended over the bump-accommodating hole 413. Moreover, the meshes may be a center-converged mesh, a square mesh, or an annular mesh. In the present embodiment, as shown in FIG. 10, the meshes is a center-converged mesh to enhance low temperature bonding of the bumps 423. Preferably, the substrate 410 is a single-layer flexible printed circuit board to achieve thinner and lighter packages. In the present embodiment, a wiring layer is formed on the second surface 412 of the substrate 410, including a plurality of inner pads 414, a plurality of outer pads 415, and the traces 416 connected the inner pads 414 and the outer pads 415. Furthermore, a solder mask 417 is formed on the second surface 412 of the substrate 410 to partially cover the trace 416 of the wiring layer.

The chip 420 has an active surface 421 and a plurality of bonding pads 422 formed on the active surface 421 where a plurality bumps 423 are disposed on the bonding pads 422. In the present embodiment, the chip 420 is a high-speed DRAM chip such as RAMBUS, DDR II, DDR III, and XDR, with the operation clock rates equal or over 400 MHz. The chip 420 is disposed on the first surface 411 of the substrate 410 with the bumps 423 aligned and embedded in the bump-accommodating holes 413. In the present embodiment, the IC package 400 further includes a die-attaching layer 450 to attach the active surface 421 of the chip 420 to the first surface 411 of the substrate 410.

The encapsulant 430 is partially formed on the second surface 412 of the substrate 410 by dispensing to encapsulate the inner pads 414. Furthermore, a second encapsulant 460 is formed on the first surface 411 of the substrate 410 to encapsulate the chip 420 to prevent penetrated moisture to hydrolyze the die-attaching material 450. In different embodiments, if the die-attaching layer 450 is moisture-resistant, then there is no need for the formation of the second encapsulant 252.

The external terminals 440 are disposed on the second surface 412 of the substrate for external electrical connections. In the present embodiment, the external terminals 440 are solder balls disposed on the outer pads 415. In different embodiments, solder balls can be replaced by solder paste, metal balls, metal pins, or ACF as external terminals 440.

The bumps 423 can be bonded to the inner pads 414 by low-temperature bonding or elastic electrical connection through the suspended meshes of the inner pads 414. Moreover, the bumps 423 can form metal bonding, such as gold-to-gold bonding or gold-to-tin bonding, with the corresponding inner pads 414 in the bump-accommodating holes 413 of the substrate 410 by using the heating temperature during die attaching step to create electrically connections between the chip 420 and the substrate 410. The conventional wire bonding processes are eliminated to simplify the packaging process flow. Preferably, the substrate 410 is a single-layer flexible printed circuit board to achieve thinner and lighter packages.

The die-attaching layer 450 can be chosen from a group of multiple-step curing adhesive paste, PI adhesive film, or epoxy adhesive film. Preferably, the die-attaching layer 450 is a multiple-step curing adhesive paste where the liquid form of the die-attaching material 240 is pre-disposed on the first surface 211 of the substrate 210 by printing, then, followed by pre-baking to become a B-stage adhesive layer. During thermal pressing step, the active surface 421 of the chip 420 is attached to the first surface 411 of the substrate 410 with the bumps 423 aligned and embedded in the corresponding bump-accommodating holes 413 and bonded to the inner pads 414. Therefore, the IC package 400 becomes thinner and lighter with shorter electrical paths, especially suitable for the mass production of high-speed memory chip 420 with lower packaging cost.

As shown in FIG. 5, the manufacturing process of the IC package 400 primarily includes step 21 of "providing a substrate", step 22 of "die attaching with bump soldering", step 23 of "encapsulating", and step 24 of "solder ball placing". In step 21, the substrate 410 has a first surface 411, a second surface 412, and a plurality of bump-accommodating holes 413 where each bump-accommodating hole 413 has an inner pad 414 on the second surface 412 and each inner pad 414 has a meshes. Preferably, the substrate 410 is a single-layer flexible printed circuit board. In step 22, as shown in FIG. 9, the die-attaching layer 450 is formed on the first surface 411 of the substrate 410. After thermal pressing the chip 420 to the substrate 410, the active surface 421 of the chip 420 is adhered to the first surface 411 of the substrate 410 by the die-attaching layer 450 with the bumps 423 aligned and embedded in the bump-accommodating holes 413. During the temperature and pressure of die-attaching, not only is the chip 420 attached to the substrate 410 by the die-attaching layer 450, but also are the bumps deformed and electrically connected to the meshes 414B of the inner pads 414 by metal bonding or elastic electrical contact to eliminate the conventional wire bonding processes. Furthermore, in step 23, the encapsulant 430 and the second encapsulant 460 are formed by dispensing. In step 24, the external terminals 440 are disposed on the outer pads 415.

Figure 11:
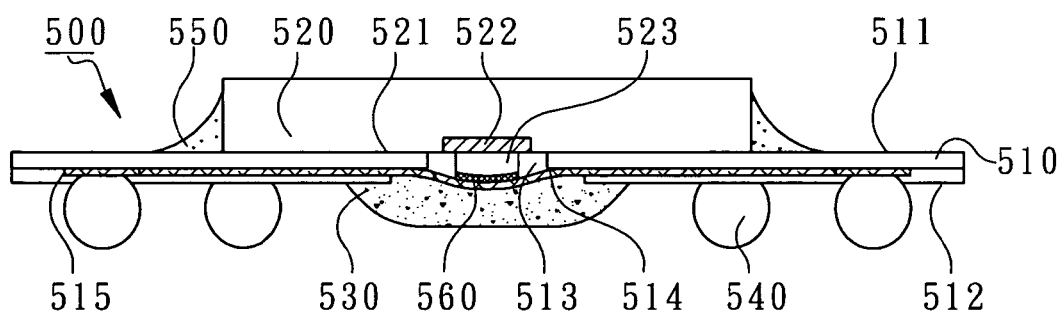
FIG. 11 shows the cross sectional view of an IC package with enhanced bondibility of the embedded bumps according to the fourth embodiment of the present invention.
Figure 12A:
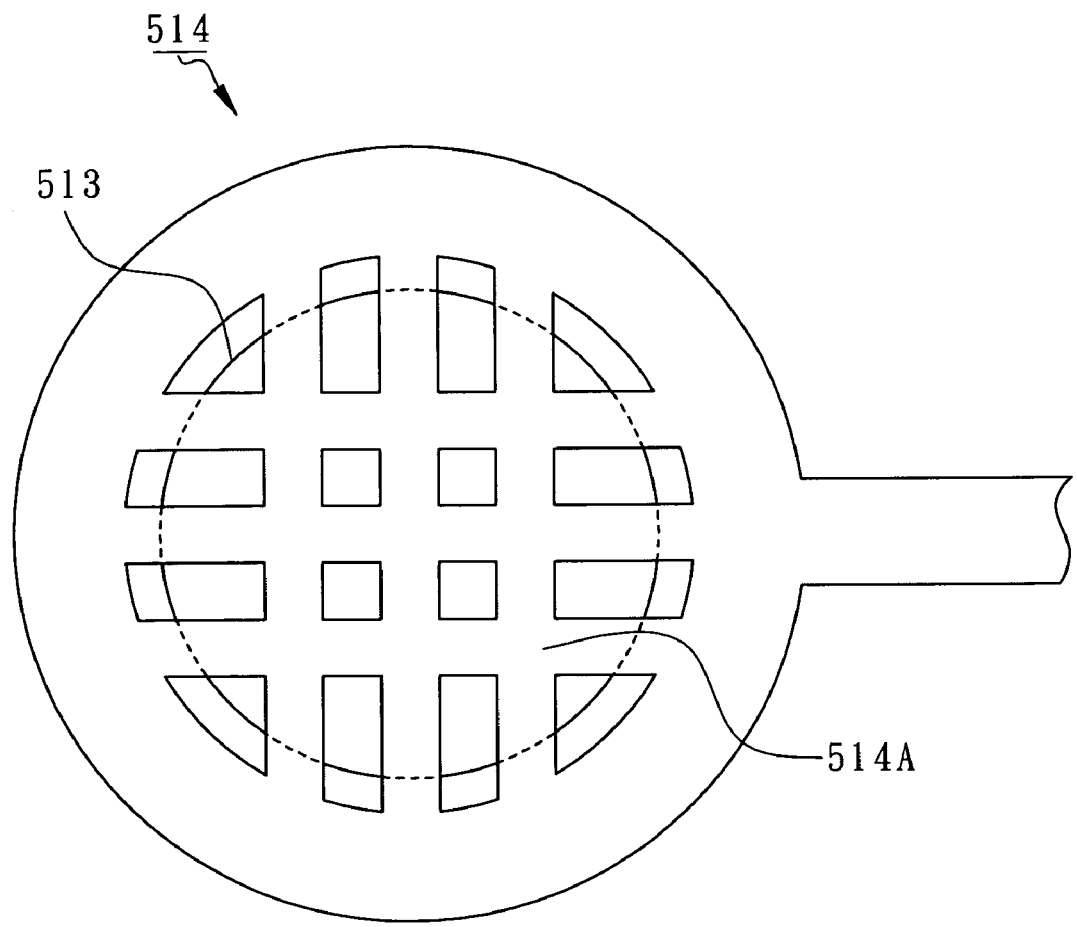
FIG. 12A shows the inner pads of the substrate of the IC package according to the fourth embodiment of the present invention.
Figure 12B:
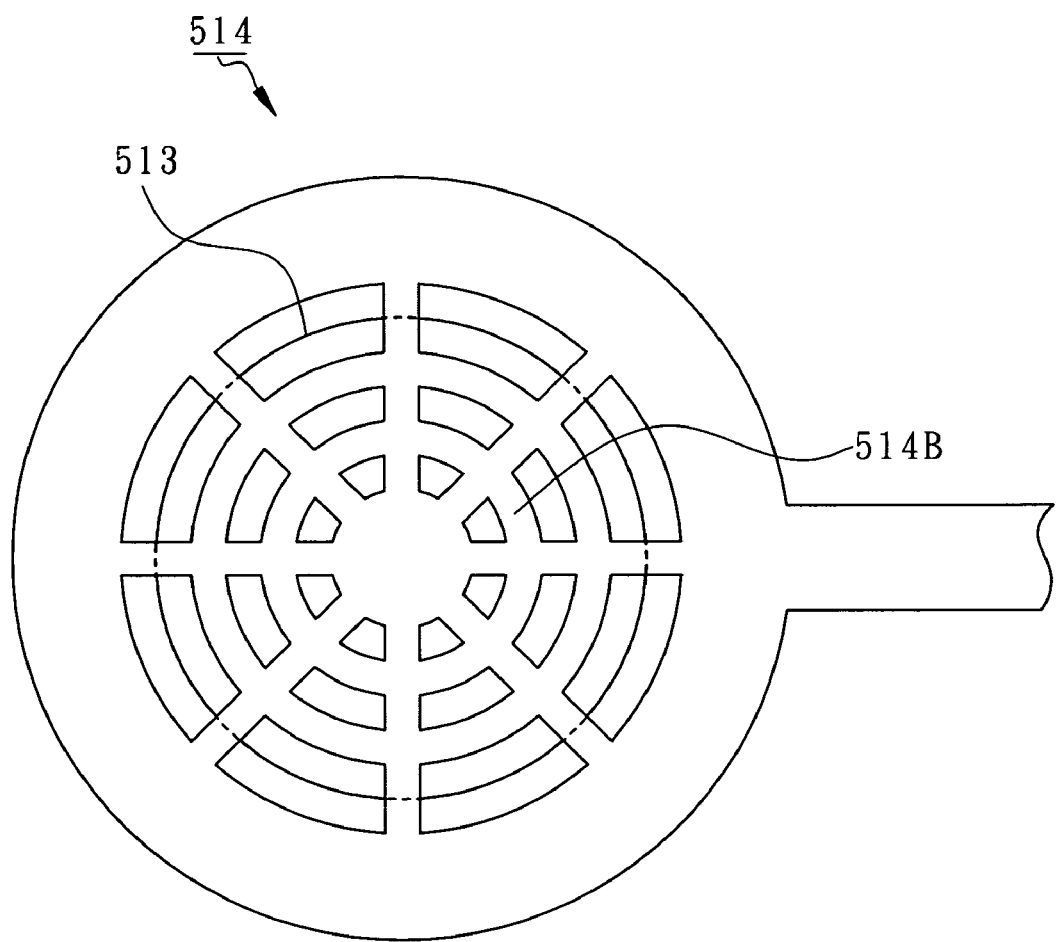
FIG. 12B shows another inner pads of the substrate of the IC package according to the fourth embodiment of the present invention.

As shown in FIG. 11, another IC package 500 is revealed in the fourth embodiment of the present invention, primarily including a substrate 510, a chip 520, an encapsulant 530, and a plurality of external terminals 540 where the substrate 510 has a first surface 511, a second surface 512, and a plurality of bump-accommodating holes 513 penetrating through the first surface 511 and the second surface 512. Each bump-accommodating hole 513 has a meshed inner pad 514 with a mesh structure 514A on the second surface 512. The meshes 514A may be a center-converged mesh, a square mesh, or an annular mesh. In one of the embodiments, as shown in FIG. 12A, the meshes of the inner pad 514 is a square mesh 514A. In another embodiments, as shown in FIG. 12B, the meshes of the inner pad 514 is a center-converged mesh 514B for the low-temperature bonding or elastic electrical contact of the bumps 523. The second surface 512 of the substrate 512 has a wiring layer, including a plurality of inner pads 514, a plurality of outer pads 515, and the traces connected the inner pads 514 and the outer pads 515. Furthermore, a soldering material 560 is formed on the surface of the inner pad 514 for the bonding between the bumps 523 and the meshes 514A of the inner pads 514. The soldering material 560 may be a tin-lead solder or lead-free solder formed by electroplating or printing. The chip 520 has an active surface 521 and a plurality of bonding pads 522 formed on the active surface 521. A plurality of bumps 523 are formed by wire bonding or electroplating on the bonding pads 522. In the present embodiment, the chip 520 is disposed on the first surface 511 of the substrate 510 with the bumps 523 aligned and embedded in the corresponding bump-accommodating holes 513. The bumps 523 are caught by the meshed inner pads 514 to achieve electrical connection. The encapsulant 530 is partially formed on the second surface 512 of the substrate 510 to encapsulate the meshes 514A of the inner pad 514. Moreover, a second encapsulant 550 is formed on the first surface 511 of the substrate 510 to enhance the adhesion between the substrate 510 and the chip 520. The external terminals 540, such as solder balls, are disposed on the outer pads 515 on the second surface 512 of the substrate 510 for external electrical connections.

The above description of embodiments of this invention is intended to be illustrative and not limiting. Other embodiments of this invention will be obvious to those skilled in the art in view of the above disclosure.

What is claimed is:

1. An IC package comprising:
   a substrate having a first surface, a second surface, a plurality of bump-accommodating holes and a plurality of meshed inner pads disposed at one ends of the corresponding bump-accommodating holes on the second surface;
   a chip having an active surface and a plurality of bumps disposed on the active surface, wherein the chip is attached to the first surface of the substrate with the bumps aligned and embedded in the corresponding bump-accommodating holes, wherein the bumps are caught by the meshed inner pads respectively;
   an encapsulant formed on the second surface of the substrate to encapsulate the meshed inner pads; and
   a plurality of outer terminals disposing on the exposed second surface of the substrate.

2. The IC package of claim 1, wherein each of the inner pads has an annular frame and a plurality of meshes, the meshes are suspended and extended from the annular frame to the centers of the bump-accommodating holes.

3. The IC package claim 1, further comprising a solder material to bond the bumps to the inner pads.

4. The IC package of claim 1, wherein the substrate has a wiring layer and a solder mask formed on the second surface, wherein the wiring layer includes the inner pads and a plurality of outer pads and the solder mask partially covers the wiring layer.

5. The IC package of claim 4, wherein the external terminals includes a plurality of solder balls disposed on the outer pads.

6. The IC package of claim 1, wherein the substrate is a single-layer flexible printed circuit board.

7. A manufacturing process of an IC package, comprising:
   providing a substrate having a first surface, a second surface, a plurality of bump-accommodating holes, and a plurality of meshed inner pads disposed at one ends of the bump-accommodating holes on the second surface;
   disposing a chip on the first surface of the substrate, the chip having an active surface and a plurality of bumps disposed on the active surface with the bumps aligned and embedded in the bump-accommodating holes, wherein the bumps are caught by the meshed inner pads respectively;
   forming an encapsulant on the second surface of the substrate to encapsulate the inner pads; and
   disposing a plurality of external terminals on the second surface of the substrate.

8. The manufacturing process of claim 7, wherein the active surface of the chip is attached to the first surface of the substrate by a die-attaching layer during the die-attaching step.

9. The manufacturing process of claim 8, wherein a solder material is melted to bond the bumps to the inner pads during the die-attaching step.

10. The manufacturing process of claim 7, wherein the substrate has a wiring layer on the second surface includes the inner pads and a plurality of outer pads for connecting the outer terminals.

11. An IC package comprising:
   a substrate having a first surface, a second surface, a plurality of bump-accommodating holes, and a plurality of inner pads disposed at one ends of the bump-accommodating holes on the second surface;
   a solder material formed on the inner pads;

a chip having an active surface and a plurality of bumps disposed on the active surface;

a die-attaching material attaching the active surface of the chip to the first surface of the substrate with the bumps aligned and embedded in the bump-accommodating holes, wherein the solder material bonds the bumps; and a first encapsulant formed on the second surface of the substrate to encapsulate the solder material and the inner pads.

12. The IC package of claim 11, wherein the inner pads are suspended and extended to the centers of the bump-accommodating holes.

13. The IC package of claim 11, wherein the substrate has a wiring layer and a solder mask formed on the second surface, wherein the wiring layer includes the inner pads and a plurality of outer pads and the solder mask partially covers the wiring layer.

14. The IC package of claim 13, further comprising a plurality of solder balls disposed on the plurality of outer pads.

15. The IC package of claim 11, wherein the substrate is a single-layer flexible printed circuit board.

16. The IC package of claim 11, further comprising a second encapsulant formed on the first surface of the substrate.

17. A manufacturing process of an IC package, comprising:

providing a substrate having a first surface, a second surface, and a plurality of bump-accommodating holes, and a plurality of inner pads disposed at one ends of the bump-accommodating holes on the second surface;

forming a solder material on the inner pads;

providing a chip having an active surface and a plurality of bumps disposed on the active surface;

performing a die-attaching step, the active surface of the chip is attached to the first surface of the substrate by a die-attaching material with the bumps aligned and embedded in the bump-accommodating holes, wherein the solder material bonds the bumps; and an encapsulation step to form a first encapsulant on the second surface of the substrate to encapsulate the solder material and the inner pads.

18. The manufacturing process of claim 17, wherein the inner pads are suspended and extended to the centers of the bump-accommodating holes before the die-attaching step.

19. The manufacturing process of claim 17, wherein the substrate has a wiring layer on the second surface including the inner pads and a plurality of outer pads, and further comprising a solder ball placing step to dispose a plurality of solder balls on the outer pads.

20. An IC package comprising:

a substrate having a first surface, a second surface, a plurality of bump-accommodating holes, and a plurality of inner pads disposed at one ends of the bump-accommodating holes on the second surface;

a solder material formed on the inner pads;

a chip having an active surface and a plurality of bumps disposed on the active surface; and a die-attaching material attaching the active surface of the chip to the first surface of the substrate with the bumps aligned and embedded in the bump-accommodating holes, wherein the solder material bonds the bumps;

wherein the substrate has a wiring layer and a solder mask formed on the second surface, wherein the wiring layer includes the inner pads and a plurality of outer pads and the solder mask partially covers the wiring layer.

21. The IC package of claim 20, wherein the inner pads are suspended and extended to the centers of the bump-accommodating holes.

22. The IC package of claim 21, further comprising a plurality of solder balls disposed on the plurality of outer pads.

23. The IC package of claim 20, wherein the substrate is a single-layer flexible printed circuit board.

24. The IC package of claim 20, further comprising a first encapsulant formed on the second surface of the substrate to encapsulate the solder material and the inner pads.

* * * * *

UNITED STATES PATENT AND TRADEMARK OFFICE
CERTIFICATE OF CORRECTION

PATENT NO. : 7,642,639 B2 Page 1 of 1
APPLICATION NO. : 11/583951
DATED : January 5, 2010
INVENTOR(S) : Huang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 477 days.

Signed and Sealed this

Sixteenth Day of November, 2010

David J. Kappos
*Director of the United States Patent and Trademark Office*